United States Patent [19]

Seki et al.

[11] Patent Number: 5,428,281
[45] Date of Patent: Jun. 27, 1995

[54] SEMICONDUCTOR INTEGRATED CIRCUIT DEVICE

[75] Inventors: Kunio Seki, Hinode; Yuichi Ohkubo, Takasaki, both of Japan

[73] Assignee: Hitachi, Ltd., Tokyo, Japan

[21] Appl. No.: 152,670

[22] Filed: Nov. 16, 1993

[30] Foreign Application Priority Data

Nov. 17, 1992 [JP] Japan ............................ 4-330932

[51] Int. Cl.⁶ .............................................. H22P 6/02
[52] U.S. Cl. ............................ 318/696; 318/254; 318/439; 363/60
[58] Field of Search ............... 317/685, 696, 439, 138, 317/254, 442, 109; 363/59, 60, 101

[56] References Cited

U.S. PATENT DOCUMENTS

| | | | |
|---|---|---|---|
| 4,870,332 | 9/1989 | Coghran et al. | 318/254 |
| 5,030,897 | 7/1991 | Ohtani et al. | 318/139 |
| 5,208,518 | 5/1993 | Grapenthin et al. | 318/439 X |
| 5,363,028 | 11/1994 | Mori | 318/254 X |

FOREIGN PATENT DOCUMENTS 63-294290  11/1988  Japan .
1-117685   5/1989   Japan .

*Primary Examiner*—William M. Shoop, Jr.
*Assistant Examiner*—Brian Sircus
*Attorney, Agent, or Firm*—Fay, Sharpe, Beall, Fagan, Minnich & McKee

[57] ABSTRACT

A semiconductor integrated circuit device incorporates a voltage step-up (boost) circuit which produces a stepped-up (boosted) voltage higher than the power voltage based on a periodic pulse signal generated internally or supplied from the outside. The stepped-up voltage is supplied to the emitter of a pnp driving transistor that produces a drive current for the output transistor on the voltage source side which is the one of a pair of npn output transistors in push-pull configuration. The voltage step-up circuit has its current supply capacity varied in response to the current flowing through the output transistor or driving transistor.

11 Claims, 4 Drawing Sheets

SEMICONDUCTOR INTEGRATED CIRCUIT DEVICE

BACKGROUND OF THE INVENTION

The present invention relates to a semiconductor integrated circuit device and to the integrated circuit technology useful for fabricating a motor drive control circuit which controls the operation of an electric motor for example.

FIG. 3 shows a motor drive control circuit, and such a control circuit is disclosed in Japanese Patent Application No. 63-294290. In the figure, indicated by H1, H2 and H3 are Hall elements which detect the rotational position of the motor magnetically. The Hall elements H1, H2 and H3 produce rotational position signals u, v and w as shown by FIGS. 4(A),4(B) and 4(C), and the signals are fed to Hall amplifiers 2, 3 and 4, respectively.

The Hall amplifiers 2, 3 and 4 amplify and shape the detected signals u, v and w, and deliver the resulting signals to a matrix circuit 6 of the next stage. From the received signals u, v and w, the matrix circuit 5 produces phase switch signals U, V and W each having a high level H, mid level M and low level L as shown by FIGS. 5(A), 5(B) and 5(C), and delivers the signals U, V and W to three-level differential circuit 9 of the next stage.

The three-level differential circuit 9 consists of a first three-level differential circuit made up of three npn bipoler transistors Q1, Q2 and Q3 and a second three-level differential circuit made up of three pnp bipoler transistors Q4, Q5 and Q6, and currents 101 and 102 are controlled by a current control circuit 8. In the three-level differential circuit 9, the npn transistors Q1, Q2 and Q3 drive output circuits A1', A3", and A5 when the phase switch signals U, V and W are at the high level H, and these transistors are cut off when the signals are at the mid level M or low level L. The pnp transistors Q4, Q5 and Q6 are cut off when the phase switch signals U, V and W are at the high level H or mid level M, and these transistors are made conductive when the signals are at the low level L.

Accordingly, the transistors Q1 and Q5 are conductive during the period between $t_0$ and $t_1$, in FIG. 4, causing the output circuit A1' on the voltage source Vcc side formed of transistors Q30 and Q31 and the output circuit A4' on the ground side (having the same transistor configuration as A2') to operate to feed a drive current to motor windings(coils) L1 and L2.

During the period between $t_1$ and $t_2$, the output circuit A1' on the voltage source side and the output circuit A6' on the ground side operate to feed a drive current to motor windings (coils) L1 and L3. In this manner, the transistors Q1-Q6 operate in accordance with the levels of the phase switch signals U, V and W to drive selectively the output circuits A1', A3' and A5' on the voltage source side and the output circuits A2', A4' and A6' on the ground side. As a result, on the waveform diagram of FIG. 4, a drive current flows in the motor windings (coils) L2 and L3 during the period between $t_2$ and $t_3$, a drive current flows in the motor windings L2 and L1 during the period between $t_3$ and $t_4$, a drive current flows in the motor windings L3 and L1 during the period between $t_4$ and $t_5$, and a drive current flows in the motor windings L3 and L2 during the period between $t_5$ and $t_6$.

In the circuit arrangement of FIG. 3, each output circuit on the voltage source side (e.g., A1') consists of a pnp transistor Q30 (pre-driver transistor) and an npn output transistor Q31, and therefore the output circuit has its load current capacity limited by the saturation voltage of the transistors Q30 and Q31.

The motor drive control circuit is used for floppy disk drive units and hard disk drive units, which are often designed to operate on a low power voltage such as 5 volts or 3 volts for the achievement of compactness and portability. In the trend of low voltage operation, the above-mentioned saturation voltage of the output circuit is no more negligible.

In dealing with this situation, a technique of applying an emitter voltage higher than Vcc to the pre-driver transistor is disclosed in Japanese Patent Application No. 1-117685 (publicized on May 10, 1989).

SUMMARY OF THE INVENTION

The inventors of the present invention have studied the low voltage and low power-consumptive operation of a motor driver fabricated as a semiconductor integrated circuit, and further studied the circuit arrangement of a voltage step-up(boost) circuit for stepping up or boosting the emitter voltage of the pre-driver transistor in consideration of the fact that the load current of the output transistors of the motor driver is large at the starting of the motor, i.e., in the initial period when the motor in stoppage accelerates to a certain rotational speed and it is very small in the steady-state operation in which the motor rotates at a certain rotational speed.

An object of this invention is to provide a semiconductor integrated circuit device having output circuits that are simple in the circuit arrangement and operate efficiently at a low power voltage.

Another object of this invention is to provide a semiconductor integrated circuit device having output circuits that are simple in the circuit arrangement, operate efficiently at a low power voltage, and consume less power.

The above objectives are achieved as follows.

The motor drive control circuit is provided with a voltage step-up (boost) circuit which produces a voltage higher than the power voltage in response to a periodic pulse signal generated within the circuit or supplied from the outside, and the produced voltage is applied to the emitter of the pnp driving transistor that provides a drive current for the npn output transistor on the voltage source side which is the one of a pair of npn output transistors in a push-pull configuration.

The motor drive circuit is further provided with a current detection means for detecting the load current of the output transistors or the current of the driving transistor, and the voltage step-up circuit has its bias current or current supply capacity controlled in accordance with the result of the current detection.

The provision of the voltage step-up circuit allows the driving transistor to operate at a higher emitter voltage than the power voltage, and the output dynamic range can be extended by the amount of the base-to-emitter voltage of the driving transistor.

Since the bias current of the voltage step-up circuit is controlled based on the result of detection of the load current of the output transistors, it is large during the starting period of the motor and it is small in the steady-state operation of the motor. Consequently, the voltage step-up circuit is prevented from dissipating a useless current, and the low-power operation of the semiconductor integrated circuit device can be accomplished.

Those and other objects and novel features of the present invention will become more apparent from the following description taken in conjunction with the accompanying drawings.

DESCRIPTION OF THE PREFERRED EMBODIMENTS

Figure 1:
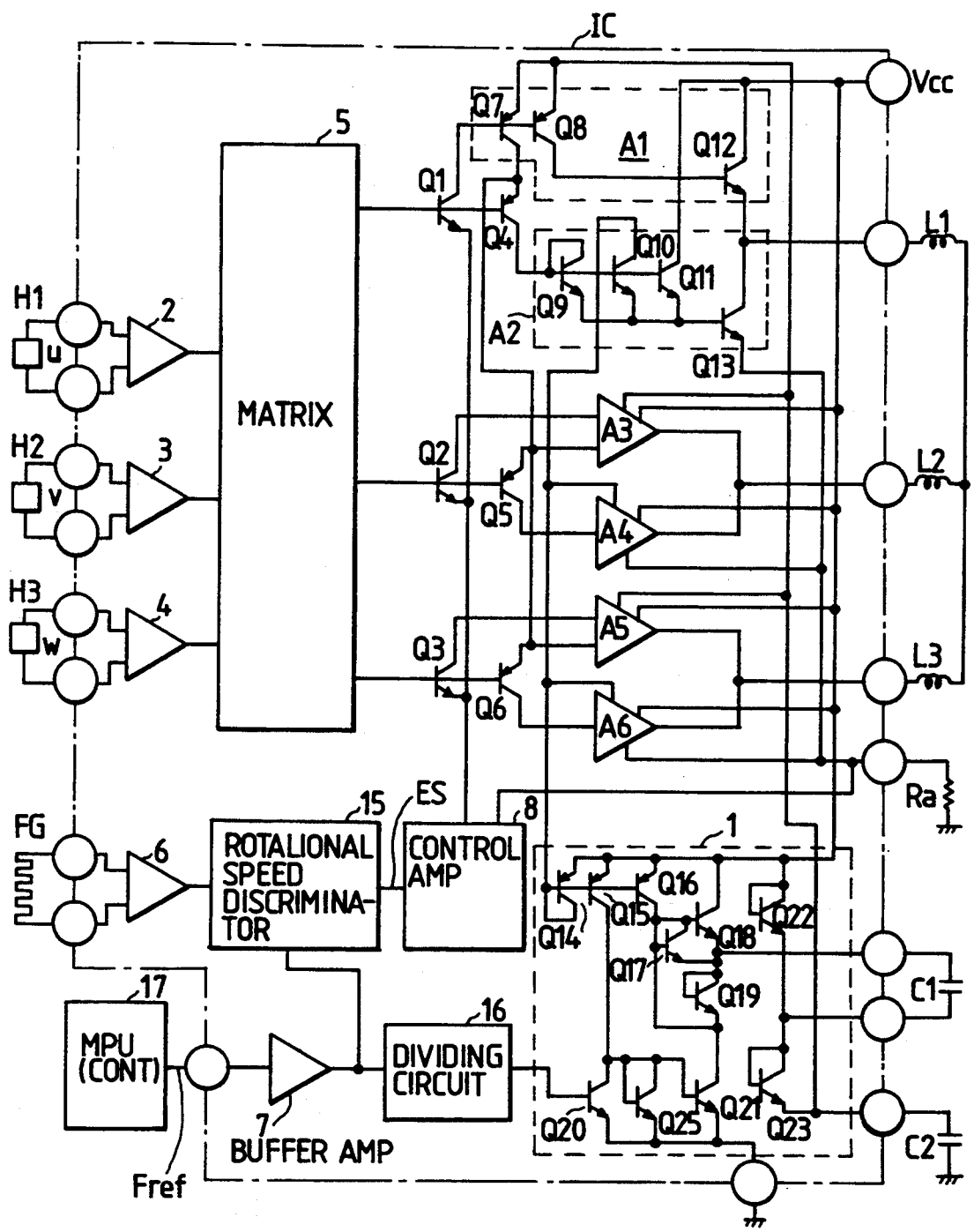
FIG. 1 is a block diagram showing the 3-phase spindle motor drive system using the semiconductor integrated circuit device based on an embodiment of this invention.

FIG. 1 is a block diagram of the 3-phase spindle motor drive system using the semiconductor integrated circuit device based on an embodiment of this invention. In the figure, the portion enclosed in a block of dash-dot line is a semiconductor integrated circuit device (IC) formed on a semiconductor substrate such as monocrystalline silicon through the process of the IC fabrication technology known in the art. Circular marks "o" aligning on the dash-dot line signify external terminals of the IC device. In this embodiment, all transistors are bipoler type.

Figure 4A:
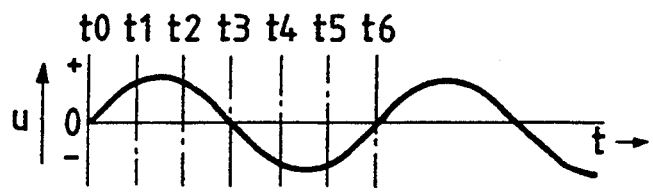
FIGS. 4(A), 4(B) and 4(C) are waveform diagrams showing the load output signals of the Hall elements used in the 3-phase spindle motor drive system.
Figure 4B:
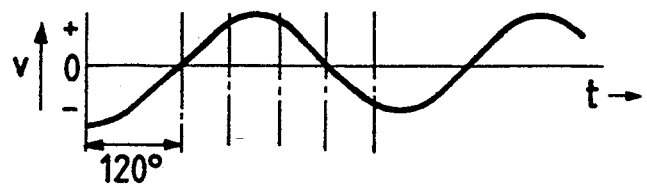
Figure 4C:
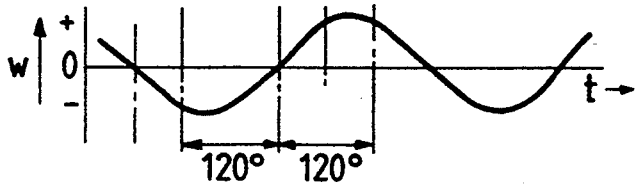

In the figure, indicated by H1, H2 and H3 are Hall elements which detect the rotational position of the motor magnetically. The Hall elements H1, H2 and H3 produce rotational position signals u, v and w as shown by FIGS. 4(A), 4(B) and 4(C), and the signals are fed to Hall amplifiers 2, 3 and 4, respectively.

Figure 5A:
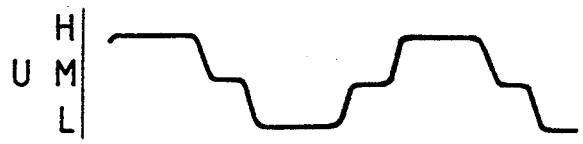
FIGS. 5(A), 5(S) and 5(C) are waveform diagrams showing the load currents of the 3-phase spindle motor drive system.
Figure 5B:
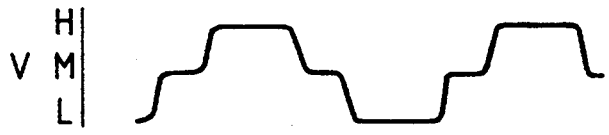
Figure 5C:

The Hall amplifiers 2, 3 and 4 amplify and shape the detected signals u, v and w, and deliver the resulting signals to a matrix circuit 5 of the next stage. From the received signals u, v and w, the matrix circuit 5 produces phase switch signals U, V and W each having a high level H, mid level M and low level L as shown by FIGS. 5(A), 5(B) and 5(C) and delivers the signals U, V and W to a three-level differential circuit of the next stage.

An FG (frequency generator) signal for detecting the motor speed is received by an FG amplifier 6. The FG amplifier 6 amplifies the FG signal and delivers the amplified signal to a rotational speed discriminator (discriminating circuit) 15. The speed discriminating circuit 15 compares the FG signal with a reference frequency signal $F_{ref}$ that is received through a buffer amplifier 7 and produces an error signal ES. The reference frequency signal $F_{ref}$ can be a clock pulse signal produced by an external IC controller 17, such as a microprocessor MPU, for example. Alternatively, the reference frequency signal $F_{ref}$ may be produced by a reference frequency generation circuit, such as a crystal oscillation circuit, included in the semiconductor integrated circuit device IC.

The speed discriminating circuit 15 smoothes the error signal by means of an integrator included in it and delivers a d.c. voltage signal. The smoothed error signal is fed to a control amplifier 8, and then delivered to the three-level differential circuit. The control amplifier 8 is controlled in response to the speed error signal so that the motor is driven at a constant speed. Namely, the speed discriminating circuit 15 functions as a control means for maintaining a constant motor speed.

The three-level differential circuit consists of a first three-level differential circuit made up of three npn bipoler transistors Q1, Q2 and Q3 and a second three-level differential circuit made up of three pnp bipoler transistors Q4, Q5 and Q6, and the load currents of these circuits are controlled by the control amplifier 8.

In the three-level differential circuit 9, the npn transistors Q1, Q2 and Q3 drive output circuits A1, A3 and A5 when the phase switch signals U, V and W are at the high level H, and these transistors are cut off when the signals are at the mid level M or low level L. The pnp transistors Q4, Q5 and Q6 are cut off when the phase switch signals U, V and W are at the high level H or mid level M, and these transistors are conductive and drive the output circuits A2, A4 and A5 when the signals are at the low level L. Consequently, drive currents for the motor windings (coils) L1, L2 and L3 are produced so that the motor rotates in the same manner as the conventional circuit arrangement explained previously.

In this embodiment of invention, the semiconductor integrated circuit device is provided with a voltage step-up (boost) circuit 1 sot hat it operates efficiently under a low power voltage. The voltage step-up circuit 1 is connected to a frequency demultiplying circuit 16 which receives the reference frequency signal Fref through the buffer amplifier 7, and it produces a voltage higher than the power voltage Vcc by using a periodic pulse signal produced by the frequency demultiplying circuit 16.

The voltage step-up circuit 1 operates as follows. When the output signal of the frequency demultiplying circuit 16 is low, an npn transistor Q20 is cut off. Consequently, npn transistors Q25 and Q21 in current mirror connection with the Q20 become conductive. With the transistor Q21 being conductive, a pnp transistor Q16 has its collector current dissipated through the Q21, and an npn transistor Q18 is cut off. The collector current of the Q21 also flows through an npn transistor Q19, causing the capacitor C1 to be charged through a transistor Q22. Accordingly, the charging capacity for the capacitor C1 is dependent on the collector current of a pnp transistor Q15.

With respect to the emitter area of the transistor Q20 as a reference emitter size, the transistors Q14, Q15, Q16, Q17, Q18, Q19, Q21, Q22, Q23 and Q25 are designed to have a proportion of emitter areas of 3:3:6:1:20:20:20:20:20:1. Accordingly, for the collector current I0 of the transistor Q15, the transistor Q21 has a collector current of $20I_0$. Since the transistor Q16 has an emitter area twice that of the Q15, the Q16 has a collector current of $2I_0$, and a current of $20I_0-2I_0=18I_0$ flows through the transistor Q19. Accordingly, the charging capacity for the capacitor C1 is dependent on the collector current of the transistor Q15.

The transistor Q15 operates by being controlled by the transistor Q14 in current mirror connection, and the current of the Q14 varies in response to the value of collector current of the transistor Q10 of the output circuit A2 (or the corresponding transistors in the output circuits A4 and A6), as will be explained later, Namely, the collector current of the transistor Q10 (or the corresponding transistors) is dependent on the load current of the output transistor Q13 in the output circuit A2 (or the corresponding output transistors in the output circuits A4 and A6). This means that the voltage step-up circuit has its bias current (or the current supply capacity) varied in response to the value of load current of the output circuit in conductive state.

When the frequency demultiplying circuit (divider) 16 has a high output signal, the transistor Q20 becomes conductive and the transistor Q21 is cut off. Consequently, the collector current of the transistor Q16 flows through the transistors Q17 and Q18. The transistor Q19 is also cut off in response to the cutting off of the Q21. The transistors Q17 and Q18 are designed to have an emitter area ratio of 1:N (where N is a positive integer greater than 1, e.g., around 20), and these transistors amplify the collector current of the Q16 and supply the amplified current to the capacitor C1.

When the frequency demultiplying circuit 16 has a low output signal, the transistor Q18 has an emitter voltage of $V_{CEQ21} + V_{BEQ19}$, which is approximately 1 volt, and the npn transistor Q22 has an emitter voltage of $V_{CC} - V_{BEQ22}$, which is approximately 4.3 volts (for $V_{CC} = 5$ volts). Accordingly, the voltage difference across the capacitor C1 is approximately 3.3 volts. When the output signal of the frequency demultiplying circuit 16 becomes high as mentioned above, the transistor Q18 has an emitter voltage of $V_{cc} - (V_{CEQ16} + V_{BEQ18})$, which is approximately $V_{CC} - 1$ V $= 4$ volts, and the transistor Q22 has an emitter voltage expressed as follows.

$$V_{CC} - (V_{CEQ16} + V_{BEQ18}) + \{V_{CC} - V_{BEQ22} - (V_{CEQ21} + V_{BEQ19})\} = 2V_{CC} - 2V_{CE(sat)} - 3V_{BE} \simeq 7.3 \text{ volts} \quad (1)$$

Where $V_{CE(sat)} = V_{CEQ16} = V_{CEQ21} \simeq 0.3$ Volt, $B_{BE} = V_{BEQ18} = V_{BEQ19} = V_{BEQ22} \simeq 0.7$ volts, and $V_{CC} = 5$ volts.

Namely, the emitter voltage of the transistor Q22 is approximately 7.3 volts, the transistor Q22 is cut off, and the transistor Q23 has a stepped-up(boosted) emitter voltage of approximately 6.6 volts as a result of smoothing by the transistor Q23 in diode connection and an external capacitor C2. In this case, the current flowing through the capacitor C1 is used to charge the capacitor C2 and also dissipated as emitter currents of the pnp transistor Q8 of the driving stage and the pnp transistor Q4 in the three-level differential circuit.

The operation of the motor drive circuit which receives the Hall element output signals shown in the waveform diagrams of FIGS. 4(A), 4(B) and 4(C) will be explained. In a complete cycle of the signals, the period between time points t0 and t1 is selected as an example for the explanation of operation. The operation of remaining periods is virtually the same as this period.

In the period between t0 and t1, the transistors Q1 and Q5 become conductive, and the output circuit A1 on the voltage source side consisting of the pnp transistors Q7 and Q8 and the npn output transistor Q12, and the output circuit A4 on the ground side (arranged identically to the output circuit A2 consisting of npn transistors Q9, Q10, Q11 and Q13) operate to feed a drive current to the motor windings L1 and L2.

The conductive npn transistor Q1 causes the pnp transistors Q7 and Q8 to become conductive, and the conductive Q8 supplies a base current to the npn transistor Q12 and it becomes conductive. The conductive transistor Q7 in the output circuit A1 causes the transistors in the output circuit A4 on the ground side (those corresponding to Q9, Q10, Q11 and Q13 in the output circuit A2) to become conductive. Namely, the pnp transistor Q7 in the output circuit A1 on the voltage source side works as a current source for the pnp transistors Q4, Q5 and Q6 that constitute the three-level differential circuit. In other words, one of the pnp transistor Q7 in the output circuit A1 and corresponding pnp transistors in the output circuits A3 and A5, all on the voltage source side, is made conductive by the conductive npn transistor Q1, Q2 or Q3 that constitutes a first three-level differential circuit, and the conductive pnp transistor (one of Q7 and corresponding transistors) works as a current source for one of the pnp transistors Q4, Q5 and Q6 that constitute a second three-level differential circuit.

In response to the conduction of the pnp transistor Q7 in the output circuit A1 on the voltage source side, the pnp transistor Q5 that forms the three-level differential circuit supplies a base current to the output transistor in the output circuit A4 on the ground side (corresponding to Q13 of the output circuit A2) by way of the transistor in A4 (corresponding to Q9 in A2). The transistors Q10 and Q11 of the output circuit A2 form a current mirror circuit with the transistor Q9, and these transistors Q9, Q10 and Q11 are designed to have a proportion of emitter areas of 1:1:15, for example. Accordingly, a current that is 17 times the current flowing through the transistor Q9 is supplied as a base current to the output transistor Q13 the emitte of which is coupled to the ground voltage (GND = 0 volt) via resister Ra.

The base current of the output transistor of the output circuit A4 on the ground side (corresponding to Q13 in A2) is detected by the transistor of A4 (corresponding to Q10 in A2). The transistor supplies its collector current to the pnp transistor Q14 in the voltage step-up circuit 1. In the voltage step-up circuit 1, the transistors Q15 and Q16 are in current mirror configuration with the transistor Q14, and the load currents of the Q15 and Q16 are varied in correspondence to the base current of the transistor Q13 in the output circuit A4.

The output transistor Q23 of the voltage step-up circuit 1 has such a stepped-up emitter voltage as about 6.6 volts which is higher than the power voltage Vcc as mentioned previously. Therefore, the transistors Q7 and Q8 are provided with a high emitter voltage of 6.6 volts, and these transistors are not brought to a saturated state. Consequently, the saturation voltage of the output circuit A1 on the voltage source side is determined from the saturation voltage $V_{CEQ12(sat)}$ between the collector and emitter of the output transistor Q12. The saturation voltage of the output circuit A4 on the ground side is naturally determined from the saturation voltage $V_{CE(sat)}$ of the output transistor similar to the saturation voltage $V_{CEQ13(sat)}$ of the output transistor Q13 in the output circuit A2. Namely, in this embodiment, the output saturation voltage (dynamic range) is determined solely from the saturation voltage between the collector and emitter of the output transistor.

Generally, starting of a motor necessitates a start-up current that is about ten times as large as the drive current needed for the steady state operation of the motor at a certain rotational speed. For example, if a motor is driven in a steady state without a load by a drive current of around 50 mA, it necessitates a start-up current as large as about 0.5 A. This 0.5 A current is naturally supplied through the output transistors of the output circuits A1–A6. Assuming that the output transistor has a current gain $h_{FE}$ of 50, it necessitates a base current as large as $0.5/50 = 10$ mA, and its driving transistor Q8 (pre-driver stage) needs to have an emitter current of at least 10 mA.

On this account, the voltage step-up circuit 1 must have an output current of at least 10 mA for the starting of the motor. Besides this emitter current of the pre-driver stage, the voltage step-up circuit 1 necessitates a current for charging the external capacitor C2, and the current to be supplied by the transistor Q23 is 10 mA×2=20 mA at minimum.

When the motor is driven in a steady state without a load, in which case the output transistors are not saturated, the load current of the transistor Q23 is about $(50 \text{ mA}/h_{FE}) \times 2 = (50/200) \times 2 = 0.5$ mA. Accordingly, the voltage step-up circuit 1 is required to deliver an output current of 20 mA at minimum to meet the start-up current, and it is several tens times in magnitude as compared with the steady state operation. On this account, if the voltage step-up circuit 1 has a fixed bias current, a large current consumption is imposed on the semiconductor integrated circuit device.

In this embodiment, the load current of the output transistor Q13 is detected with the transistor Q10 (load current detection means) located in front of the base of Q13 and the current value is imparted to the transistor Q14 so that the voltage step-up circuit 1 has a bias current in proportion to the detected load current, as described above, thereby solving the foregoing prior art problem. The power dissipation at starting is virtually determined from the load currents of the output transistors and the power consumption of the voltage step-up circuit 1 is not a crucial matter. In the steady state operation, the current of the voltage step-up circuit 1 is small enough relative to the bias currents of other circuit blocks, and the low-power operation can be accomplished.

The voltage step-up circuit 1 can have a single bias source circuit by detecting the load current of each phase of the 3-phase motor driver and delivering the current value to one bias source (corresponding to Q14). Namely, each phase has a 120° current conduction, and the bias current of the voltage step-up circuit 1 does not much vary for each phase due to the conductive state of any one output transistor (corresponding to Q11) in one period. Although in this embodiment the load current of the output transistor Q10 is detected through the detection of its base current (the load current of the driving transistor), a conceivable alternative scheme is to detect the load current of the output transistor directly.

Figure 2:
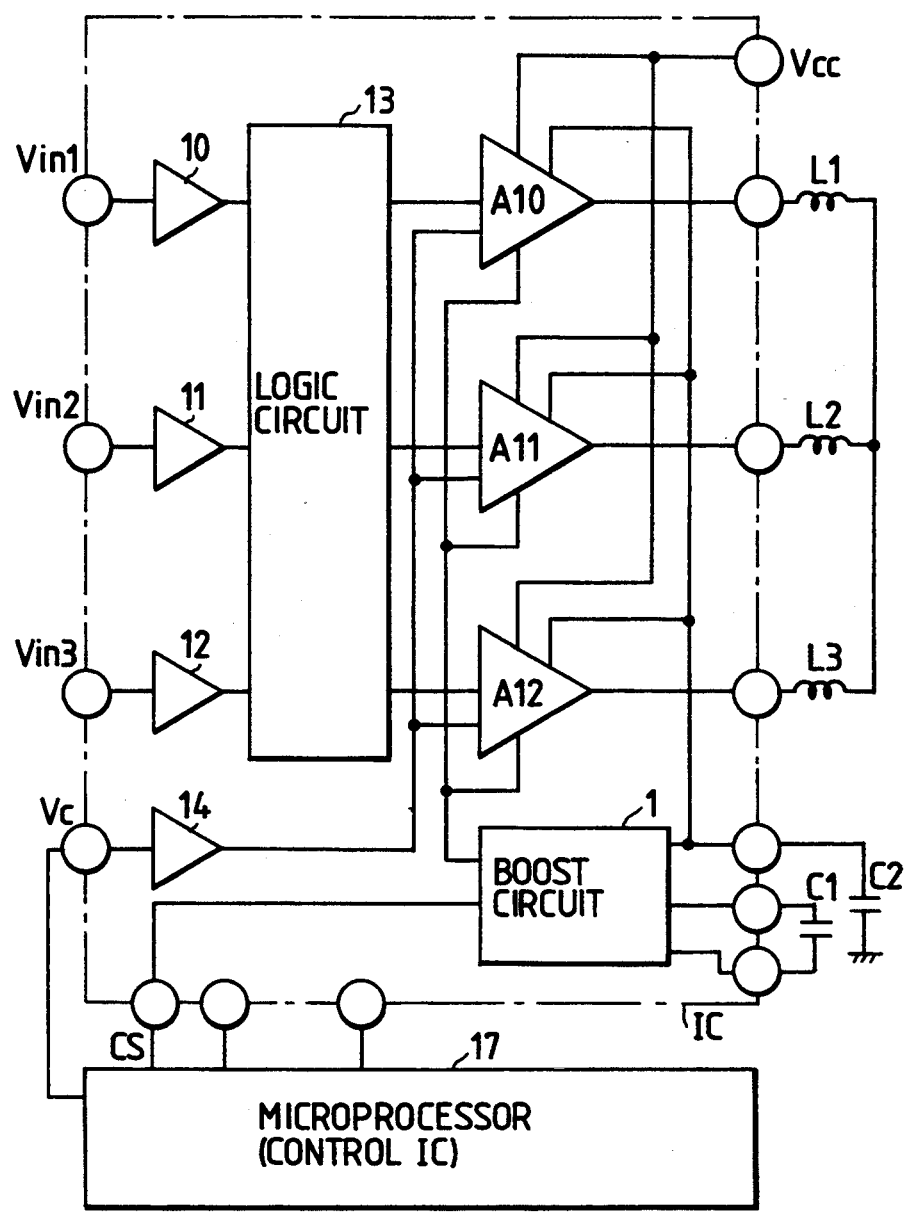
FIG. 2 is a block diagram showing the semiconductor integrated circuit device based on another embodiment of this invention.
Figure 3:
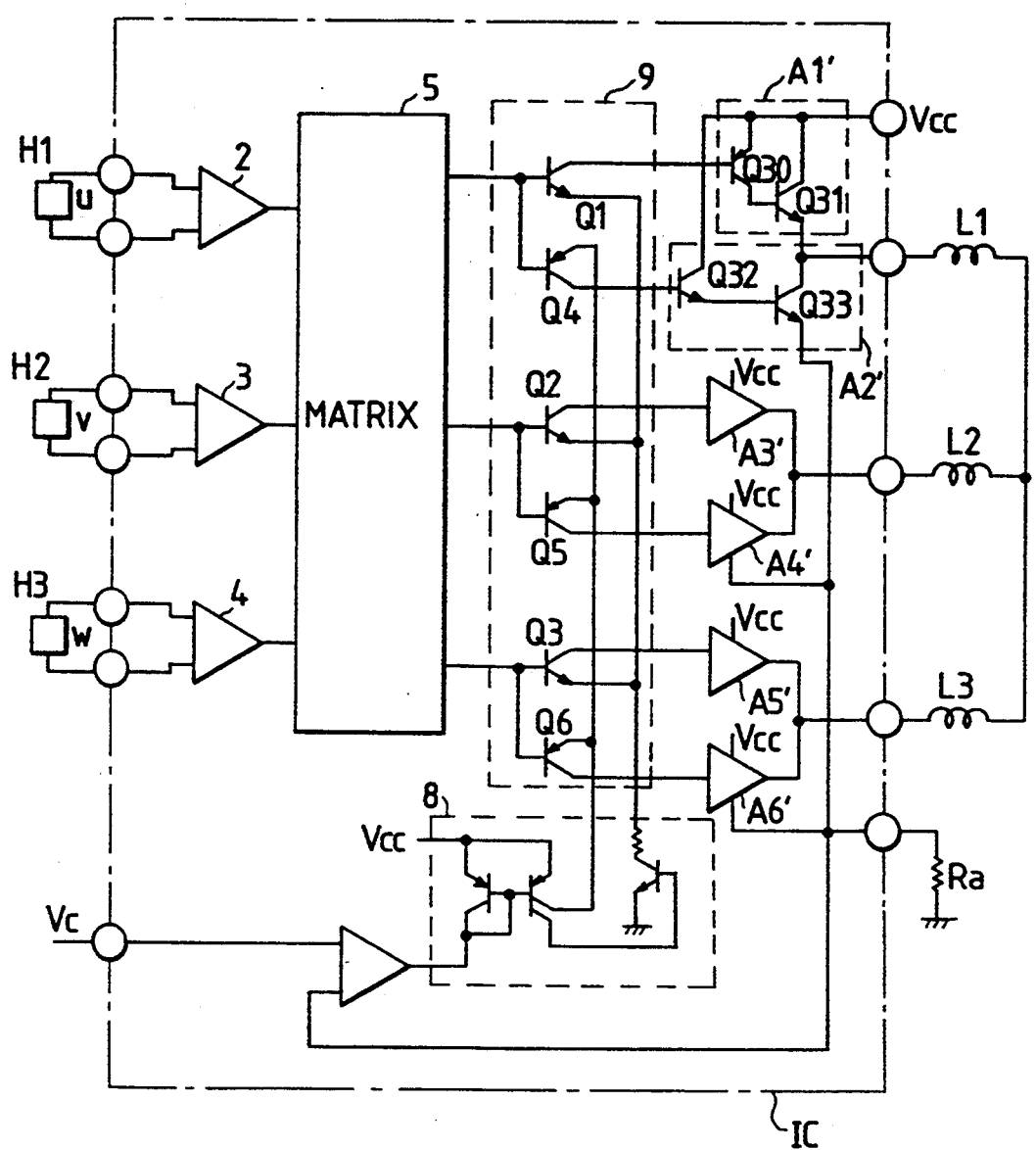
FIG. 3 is a block diagram showing an example of the conventional 3-phase spindle motor drive system.

FIG. 2 is a block diagram of another embodiment of this invention. In this embodiment, there are three input signals Vin1, Vin2 and Vin3, and these signals are entered to a logic circuit 13 through respective input buffers 10, 11 and 12. The logic circuit 13 activates one of power amplifiers A10, A11 and A12 depending on the input signals. The input signals Vin1, Vin2 and Vin3 can be signals provided by Hall elements.

The power amplifiers A10–A12 are supplied with a stepped-up voltage produced by such a voltage step-up circuit 1 as described previously. The load currents of the power amplifiers A10–A12 are controlled by the control IC 17 which includes a microprocessor. The control voltage Vc produced by the control IC is delivered to the power amplifiers A10–A12 through an input buffer 14.

The voltage step-up circuit 1 has its bias current controlled by the control signal CS provided by the control IC in order to minimize its current consumption. Specifically, the control IC 17 produces a control signal CS in correspondence to the control voltage Vc and sets the bias current of the voltage step-up circuit 1. Consequently, the voltage step-up circuit 1 has its bias current varied in proportion to the load currents of the power amplifiers A10–A12, and virtually the same current control as of the preceding embodiment of FIG. 1 is implemented. The control signal produced by the control IC 17 may be designed to comprehend various operating parameters including the motor on/off signal, reference clock signal and stepped-up voltage level of the voltage step-up circuit 1.

The effectiveness attained by the foregoing embodiments of this invention is as follows.

(1) By supplying the pnp driving transistor, which drives the output transistor on the voltage source side which is the one a pair of npn output transistors in push-pull configuration, with a stepped-up (boosted) emitter voltage higher than the power voltage produced by means of a voltage step-up (boost) circuit based on a periodic pulse signal generated internally or supplied from the outside, the output dynamic range can be extended by the amount of the base-to-emitter voltage of the driving transistor.

(2) By controlling the voltage step-up circuit for its current supply capacity in response to the load current of the output transistors or driving transistor, the power consumption of the circuit can be minimized.

(3) By supplying all output transistors with a common stepped-up voltage produced by the single voltage step-up circuit, the circuit arrangement can be simplified and the number of external parts and external terminals can be minimized.

(4) By supplying the voltage step-up circuit with the periodic pulse signal that is derived from the clock pulse signal of an external control circuit, the circuit arrangement can be simplified.

Although specific embodiments of this invention have been explained, the present invention is not confined to these embodiments, but various modifications are possible within the scope of the invention. For example, any voltage step-up circuit based on a periodic pulse signal and bootstrap capacitance may be employed.

Although the foregoing embodiments of this invention are semiconductor integrated circuit devices intended for a drive circuit of a 3-phase brushless motor, the present invention is applicable extensively to semiconductor integrated circuit devices having power amplifying circuits for driving stepping motors of floppy disk drive units, motors of hard disk drive units, motors of video tape recorders, and the like.

Although the motor drivers of the foregoing embodiments are based on bipoler transistors, the present invention is also applicable to motor drivers based on MOSFETs.

What is claimed is:

1. A semiconductor integrated circuit device comprising:

a pair of output transistors of an NPN type in push-pull configuration;

a driving transistor of a PNP type for producing a driving current for one of the pair of output transistors which is provided on a voltage source side; and a boost circuit coupled to receive a periodic pulse signal and for producing a boosted voltage higher than a power supply voltage and supplying the boosted voltage to an emitter of the driving transistor, wherein the boost circuit is controlled for a current supply capacity thereof in response to a value of a current flowing through the one of the pair of output transistor or the driving transistor.

2. A semiconductor integrated circuit device according to claim 1, wherein a plurality of set of the pairs of output transistors are provided, wherein a plurality of the driving transistors are provided so that one driving transistor drives one of the pair of output transistors in one set, and wherein the boost circuit supplies the boosted voltage to the plurality of driving transistors in common.

3. A semiconductor integrated circuit device according to claim 2, wherein said boost circuit is controlled for the current supply capacity thereof by an external control circuit.

4. A semiconductor integrated circuit device according to claim 3, wherein the boost circuit receives a clock pulse signal of the external control circuit as the periodic pulse signal.

5. A motor driver for driving a motor to be coupled thereto, the motor driver comprising:

a pair of output transistors of an NPN type in push-pull configuration for driving the motor;

a driving transistor of a PNP type for producing a driving current for one of the pair of output transistors which is provided on a voltage source side; and a boost circuit coupled to receive a periodic pulse signal and for producing a boosted voltage higher than a power supply voltage and supplying the boosted voltage to an emitter of the driving transistor, wherein the boost circuit is controlled for a current supply capacity thereof in response to a value of a current flowing through the one of the pair of output transistor or the driving transistor.

6. A motor driver according to claim 5, wherein a three set of the pairs of output transistors are provided for delivering three coils in the motor, respectively, wherein a plurality of the driving transistors are provided so that one driving transistor drives one of the pair of output transistors in one set, and wherein the boost circuit supplies the boosted voltage to the plurality of driving transistors in common.

7. A motor driver according to claim 6, wherein the motor is a stepping motor.

8. A motor driving system comprising:

a motor including a plurality of coils; and a motor driving circuit for driving the motor, wherein the motor driving circuit includes:

a plurality of output circuits which are coupled to the coils of the motor, respectively, wherein each of the plurality of output circuits includes output transistors coupled in push-pull configuration between a first supply voltage and a second supply voltage lower than the first supply voltage, driving transistors for the output transistors for driving the selected output transistors, and a boost circuit coupled to receive a periodic pulse signal and for producing a boosted voltage higher than the first supply voltage and supplying the boosted voltage to an emitter of one of the driving transistors, wherein the boost circuit is controlled for a current supply capacity thereof in response to a value of a current flowing through the selected output transistors or the driving transistor.

9. A motor driving system according to claim 8, wherein the driving transistors are of a PNP type, and wherein the output transistors are of an NPN type.

10. A motor driving system according to claim 9, wherein the motor driving system includes a floppy disk drive unit.

11. A motor driving system according to claim 9, wherein the motor driving system includes a hard disk drive unit.

* * * * *